United States Patent [19]

Thanos

[11] 3,968,438
[45] July 6, 1976

[54] OFF CHANNEL GAIN CONTROL CIRCUIT
[75] Inventor: Harry Thanos, Greenville, R.I.
[73] Assignee: North American Philips Corporation, New York, N.Y.
[22] Filed: Feb. 27, 1975
[21] Appl. No.: 553,542

[52] U.S. Cl. .................................. 325/319; 325/401
[51] Int. Cl.² .......................................... H04B 1/16
[58] Field of Search ........... 325/319, 397, 399, 400, 325/401, 404, 405, 411, 413, 414, 378, 379

[56] References Cited
UNITED STATES PATENTS

| | | | |
|---|---|---|---|
| 3,079,558 | 2/1963 | Spencer | 325/478 |
| 3,115,547 | 12/1963 | Tschannen | 325/411 |
| 3,478,271 | 11/1969 | Ison | 325/478 |
| 3,490,046 | 1/1970 | Russell | 325/411 |
| 3,581,210 | 5/1971 | Amfahr | 325/411 |
| 3,622,887 | 11/1971 | Byles | 325/413 |

Primary Examiner—Benedict V. Safourek
Assistant Examiner—Jin F. Ng
Attorney, Agent, or Firm—Frank R. Trifari; Henry I. Steckler

[57] ABSTRACT

A circuit controls the gain of a first active stage in a radio receiver. The control voltage is derived from a point ahead of a filter, and thus controls the gain when a strong off channel signal is present. A normal AGC can also be used for on channel signals.

8 Claims, 1 Drawing Figure

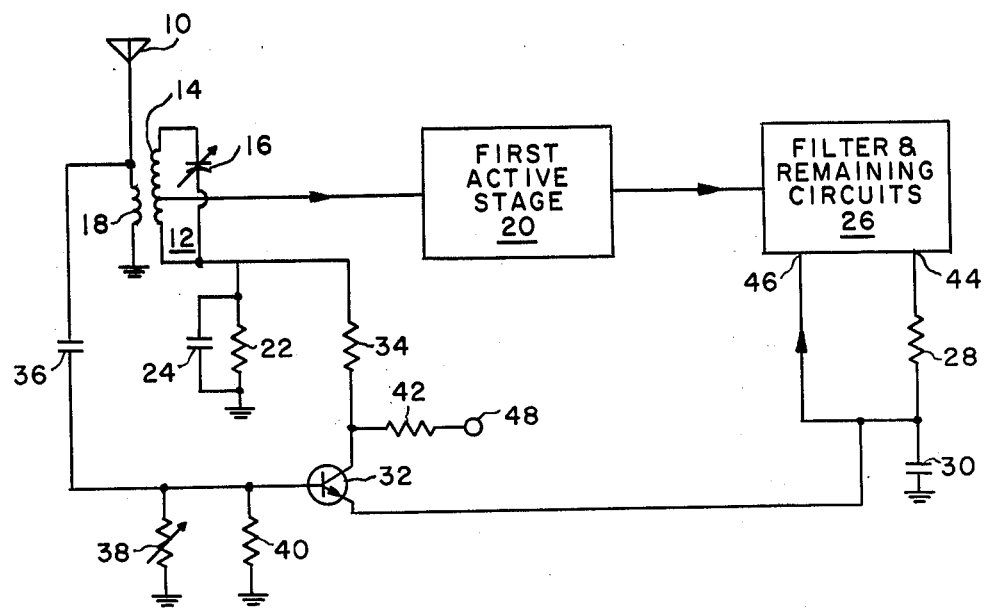

OFF CHANNEL GAIN CONTROL CIRCUIT

The present invention relates to gain control circuits, and more particularly, those that control gain when a strong off channel signal is present.

Typical prior art automatic gain control circuits derive the gain control voltage from the detector. Since this is after the receiver filter, such a circuit cannot control the gain when a strong off channel, i.e. out of the filter bandpass, signal is present. This is especially true in present day receivers which use lumped selectivity techniques to achieve sharp passbands. Normally this does not cause any problems. However, if a very strong off channel signal is present, it can overload the first active stage of the receiver and cause desensitization and spurious signal generation.

It is therefore an object of the present invention to prevent spurious signal generation in a receiver.

It is another object to control the gain of a receiver in accordance with the strength of signals outside of the normal passband.

It is a further object to control the gain of the receiver first active stage in accordance with off channel signals.

In brief, these and other objects are achieved by having means for deriving an off channel gain control voltage from a point ahead of the receiver filter. The voltage is applied to a first active stage to control the gain thereof when the signal exceeds a selected threshold. Thus spurious signal generation is prevented.

These and other objects, features, and advantages will become apparent from the following description when taken in conjunction with the drawing in which:

The sole FIGURE is partially schematic and partially block diagram of the invention.

The FIGURE shows an antenna 10 which applies an input signal to a tuned circuit 12 comprising a coil 14 and a variable capacitor 16 by means of a link 18. Th signal then is applied to a first active stage 20, which can conventionally be either an RF amplifier or a mixer to which resistor 22 and capacitor 24 supply bias. Thereafter, th signal goes to the remaining circuits 26 which successively comprise a mixer, I.F. filter, I.F. amplifier, detector, and audio amplifier. If amplifier stage 20 comprises a mixer, then the remaining circuits would be similar except for the exclusion of a mixer. The output 44 of the detector (not shown) is coupled to the normal gain control circuit including resistor 28 and capacitor 30. The voltage across capacitor 30 is applied to the I.F. amplifiers by means of normal gain control input 46 within circuits 26 and to the emitter of transistor 32. A capacitor 36 couples some of the input signal to variable resistor 38, fixed bias resistor 40, and the base of transistor 32. A terminal 48 receives the B+ voltage and applies it through resistor 42 to the collector of transistor 32.

In operation, an input signal is received by antenna 10 and applied to tuned circuit 12, amplified or converted by active stage 20 and then filtered and further amplified by circuits 26. If the input signal is weak, then almost no voltage is developed across capacitor 30 and hence no AGC voltage is applied to circuits 26 and the emitter of transistor 32 is at ground. There is a high voltage at the collector of transistor 32 which is applied to stage 20 through resistor 34 and circuit 12. This sets the gain of stage 20 to a high value. If now a strong off channel signal appears, it will be applied to the base of transistor 32 by capacitor 36. When it exceeds a threshold adjustably determined by resistor 38, typically about 0.1 volts, it is rectified by the base-emitter junction of transistor 32 and causes increased current conduction in the collector-emitter path therein. This causes a lowering of the collector voltage. This lower voltage reduces the gain of stage 20, thereby minimizing overload and spurious frequency generation. If there is a strong on channel signal present, then an AGC voltage is developed across capacitor 30 and applied to circuits 26 through input 46, particularly the I.F. amplifiers therein. This voltage, which typically can be as much as 0.7 volts, is also applied to the emitter of transistor 32, thus reverse biasing its emitter-base junction and cutting off the off channel gain control means. In this case the on channel circuit does the entire gain controlling.

Although one embodiment has been disclosed, it will be appreciated that many variations are possible without departing from the spirit and scope of the invention. For example, although reverse AGC has been shown, forward AGC could also be used. Also the audio gain could be controlled using the off channel gain control voltage. In addition, the oscillator activity could be controlled to reduce the generation of spurious signals. The present invention is equally applicable to I.C. or discrete radios, televisions, communication receivers, etc..

I claim:

1. A circuit comprising a signal path including a tuned circuit input means for receiving an input signal, a first active stage coupled to said input means and a filter means coupled to said active stage for defining on channel signals within the passband of the filter and off channel signals outside of said passband, off channel gain control means having an input coupled to said tuned circuit input means for receiving strong signals across said tuned circuit and an output means coupled to said active stage for controlling the gain thereof in accordance with the strength of an off channel signal, and an on channel gain control means having an input coupled to said path after said filter and an output coupled to said active stage through said tuned circuit input means.

2. A circuit as claimed in claim 1 wherein said active stage comprises a radio frequency amplifier.

3. A circuit as claimed in claim 1 wherein said active stage comprises a mixer.

4. A circuit as claimed in claim 1 said off channel gain control means further comprises adjustable means for setting a threshold.

5. A circuit as claimed in claim 1 further comprising means coupled between both of said control means for preventing operation of said off channel means when said on channel means is operating.

6. A circuit as claimed in claim 1 wherein said off channel gain control comprises a transistor having a base coupled to said path, and a collector coupled to said active stage.

7. A circuit as claimed in claim 6 further comprising a threshold adjusting variable resistor coupled to said base.

8. A circuit as claimed in claim 6 wherein said transistor further comprises an emitter, and further comprising an on channel gain control means having an input coupled to said path after said filter and an output means coupled to said emitter for cutting off said off channel gain control means when said on channel means is operating.

* * * * *